United States Patent
Mikoshiba et al.

(10) Patent No.: US 10,814,626 B2
(45) Date of Patent: Oct. 27, 2020

(54) LIQUID EJECTING HEAD AND LIQUID EJECTING APPARATUS

(71) Applicant: Seiko Epson Corporation, Tokyo (JP)

(72) Inventors: Masanori Mikoshiba, Suwa (JP); Katsutomo Tsukahara, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/445,444

(22) Filed: Jun. 19, 2019

(65) Prior Publication Data
US 2019/0389215 A1 Dec. 26, 2019

(30) Foreign Application Priority Data

Jun. 20, 2018 (JP) ................. 2018-117049

(51) Int. Cl.
*B41J 2/14* (2006.01)
*H01L 41/08* (2006.01)

(52) U.S. Cl.
CPC ........ *B41J 2/14233* (2013.01); *H01L 41/081* (2013.01); *B41J 2002/14241* (2013.01); *B41J 2002/14491* (2013.01); *B41J 2202/03* (2013.01); *B41J 2202/11* (2013.01)

(58) Field of Classification Search
CPC ............... B41J 2/14233; B41J 2202/03; B41J 2202/11; B41J 2002/14241; B41J 2002/14491; H01L 41/081
See application file for complete search history.

(56) References Cited

U.S. PATENT DOCUMENTS

| 2009/0237454 A1* | 9/2009 | Kanemoto | B41J 2/14233 347/47 |
| 2013/0076832 A1* | 3/2013 | Sayama | B41J 2/14233 347/47 |
| 2013/0250003 A1* | 9/2013 | Nariai | B41J 2/14233 347/47 |
| 2017/0113462 A1 | 4/2017 | Takahashi et al. | |

FOREIGN PATENT DOCUMENTS

JP 2017-080946 A 5/2017

* cited by examiner

*Primary Examiner* — Geoffrey S Mruk
(74) *Attorney, Agent, or Firm* — Harness, Dickey & Pierce, P.L.C.

(57) ABSTRACT

A liquid ejecting head including a vibration plate that forms a wall surface of a pressure chamber filled with a liquid; and a piezoelectric element that vibrates the vibration plate to eject the liquid in the pressure chamber from nozzles, in which the vibration plate includes a first layer formed of silicon oxide, a second layer formed of zirconium oxide on a side opposite to the pressure chamber when viewed from the first layer, a ratio of a film thickness of the second layer to a film thickness of the first layer is 0.16 or more, and the film thickness of the second layer is 300 nm or more.

8 Claims, 9 Drawing Sheets

FIG. 10

| SAMPLE | Wc | Wp | W1 | T1 | T2 | Ta | Q | TRANSVERSE CRACKS + EDGE BURNING | LONGITUDINAL CRACKS |
|---|---|---|---|---|---|---|---|---|---|
| 1 | 70.6 | 50 | 42 | 400 | 330 | 1370 | 0.194 | 100% | 0.0% |
| 2 | 70.6 | 50 | 42 | 550 | 480 | 1370 | 0.350 | 100% | 0.0% |
| 3 | 70.6 | 50 | 42 | 700 | 630 | 1370 | 0.460 | 100% | 0.0% |
| 4 | 70.6 | 50 | 42 | 400 | 330 | 1580 | 0.209 | 100% | 0.0% |
| 5 | 70.6 | 50 | 42 | 400 | 330 | 1730 | 0.191 | 100% | 0.0% |
| 6 | 70.6 | 50 | 42 | 400 | 330 | 1880 | 0.176 | 100% | 0.0% |
| 7 | 71.7 | 52 | 44 | 250 | 200 | 1280 | 0.156 | 81.8% | 18.2% |
| 8 | 71.7 | 52 | 44 | 400 | 200 | 1280 | 0.156 | 98.9% | 1.1% |
| 9 | 71.7 | 52 | 44 | 550 | 200 | 1280 | 0.156 | 56.2% | 43.8% |
| 10 | 71.7 | 52 | 44 | 700 | 200 | 1280 | 0.156 | 76.7% | 23.3% |
| 11 | 71.7 | 52 | 44 | 645 | 575 | 1085 | 0.156 | 97.8% | 2.2% |

LIQUID EJECTING HEAD AND LIQUID EJECTING APPARATUS

The present application is based on, and claims priority from, JP Application Serial Number 2018-117049, filed Jun. 20, 2018, and JP Application Serial Number 2018-211296, filed Nov. 9, 2018, the disclosures of which are hereby incorporated by reference herein in their entirety.

BACKGROUND

1. Technical Field

The present disclosure relates to a technique for ejecting liquid such as ink through vibration of a vibration plate.

2. Related Art

To date, there has been proposed a liquid ejecting head that ejects a liquid in a pressure chamber from a nozzle by vibrating a vibration plate that forms a wall surface of the pressure chamber by using a piezoelectric element. For example, JP-A-2017-80946 discloses a configuration in which a vibration plate is formed by stacking a first layer formed of silicon oxide ($SiO_2$) and a second layer formed of zirconium oxide ($ZrO_2$). On the surface of the vibration plate, a piezoelectric element in which a first electrode, a piezoelectric layer, and a second electrode are stacked is formed.

Recent liquid ejecting heads are required to have a high nozzle density. In order to sufficiently vibrate a vibration plate in a configuration in which nozzles are disposed in a high density, it is important to reduce the thickness of the vibration plate. However, in a configuration in which the vibration plate is made thin, cracks may occur in the vibration plate because mechanical strength tends to be insufficient.

SUMMARY

According to an aspect of the present disclosure a liquid ejecting head includes a vibration plate that forms a wall surface of a pressure chamber filled with a liquid; and a piezoelectric element that vibrates the vibration plate to eject the liquid in the pressure chamber from nozzles, in which the vibration plate includes a first layer formed of silicon oxide, a second layer formed of zirconium oxide on a side opposite to the pressure chamber when viewed from the first layer, a ratio of a film thickness of the second layer to a film thickness of the first layer is 0.16 or more, and the film thickness of the second layer is 300 nm or more.

BRIEF DESCRIPTION OF THE DRAWINGS

FIG. 10 is a table illustrating each numerical value of FIG. 9.

DESCRIPTION OF EXEMPLARY EMBODIMENTS

Structure of Liquid Ejecting Apparatus

Figure 1:
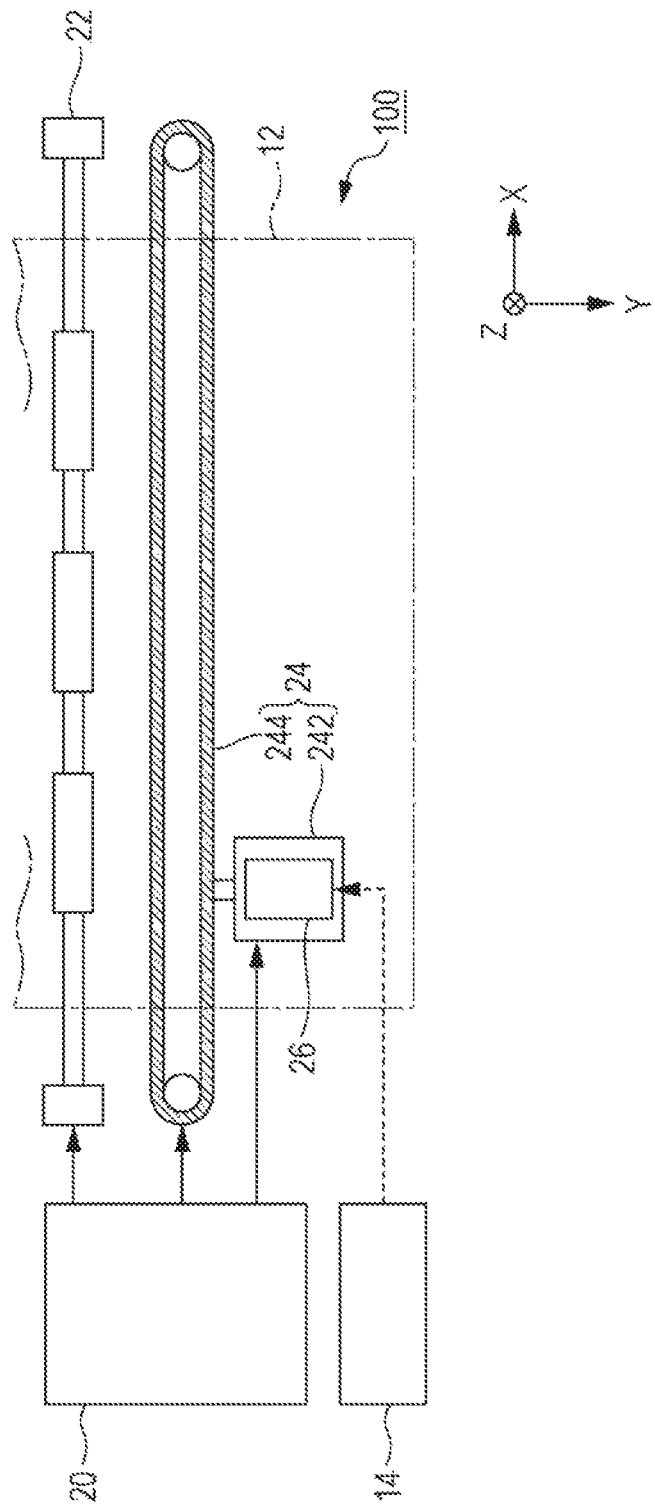
FIG. 1 is a structural diagram of a liquid ejecting apparatus according to an embodiment of the disclosure.

FIG. 1 is a structural diagram of a liquid ejecting apparatus 100 according to a preferred embodiment of the disclosure. The liquid ejecting apparatus 100 according to this embodiment is an ink jet type printing apparatus that ejects ink, which is an example of a liquid, onto a medium 12. Typically, the medium 12 is printing paper, but a printing target including any material such as a resin film or cloth is used as the medium 12. As illustrated in FIG. 1, the liquid ejecting apparatus 100 is provided with a liquid container 14 that stores ink. For example, a cartridge removably attached to or detached from the liquid ejecting apparatus 100, a bag-shaped ink pack formed of a flexible film, or an ink tank capable of replenishing ink is used as the liquid container 14.

As illustrated in FIG. 1, the liquid ejecting apparatus 100 includes a control unit 20, a transport mechanism 22, a movement mechanism 24, and a liquid ejecting head 26. The control unit 20 includes, for example, a processing circuit such as a central processing unit (CPU) or field programmable gate array (FPGA) and a memory circuit such as a semiconductor memory and integrally controls each component of the liquid ejecting apparatus 100. The transport mechanism 22 transports the medium 12 in a Y direction under the control of the control unit 20.

The movement mechanism 24 reciprocates the liquid ejecting head 26 in an X direction under the control of the control unit 20. The movement mechanism 24 according to this embodiment includes a transport body 242, which is substantially box-shaped and which houses the liquid ejecting head 26, and a transport belt 244 to which the transport body 242 is fixed. The X direction is a direction in which the liquid ejecting head 26 moves relative to the medium 12, and in a configuration in which the liquid ejecting head 26 moves together with the transport body 242, is a direction that intersects the Y direction in which the medium 12 is transported. The X direction is preferably perpendicular to the Y direction. Further, a configuration in which a plurality of the liquid ejecting heads 26 are mounted on the transport body 242 or a configuration in which the liquid container 14 is mounted on the transport body 242 together with the liquid ejecting heads 26 may be adopted. In a configuration in which the liquid ejecting head 26 does not move, the direction in which the medium 12 moves corresponds to the Y direction. The Y direction is an example of a first direction, and the X direction is an example of a second direction.

The liquid ejecting head 26 ejects ink supplied from the liquid container 14 onto the medium 12 from a plurality of nozzles under the control of the control unit 20. An image is formed on the surface of the medium 12 by each of the liquid ejecting heads 26 ejecting ink onto the medium 12 in parallel with the transport of the medium 12 by the transport mechanism 22 and the repetitive reciprocation of the transport body 242.

Figure 2:
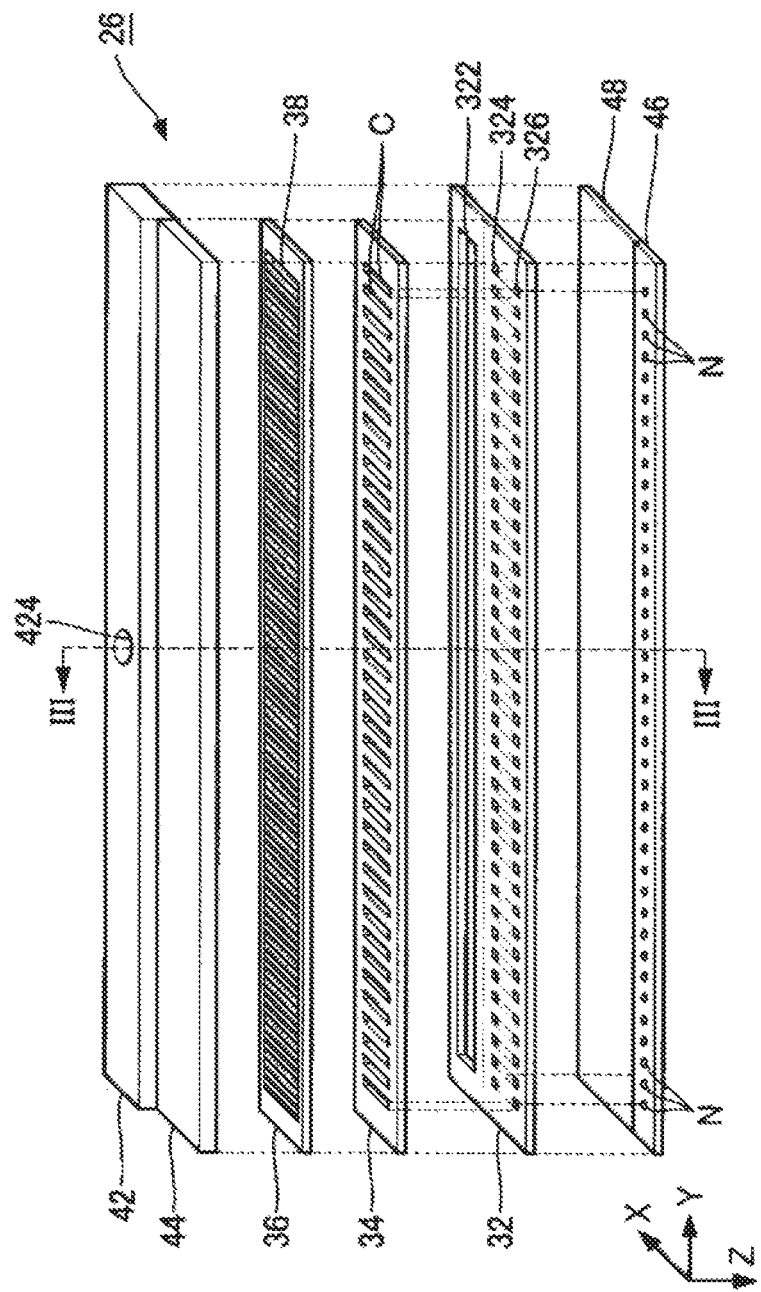
FIG. 2 is an exploded perspective view of a liquid ejecting head.
Figure 3:
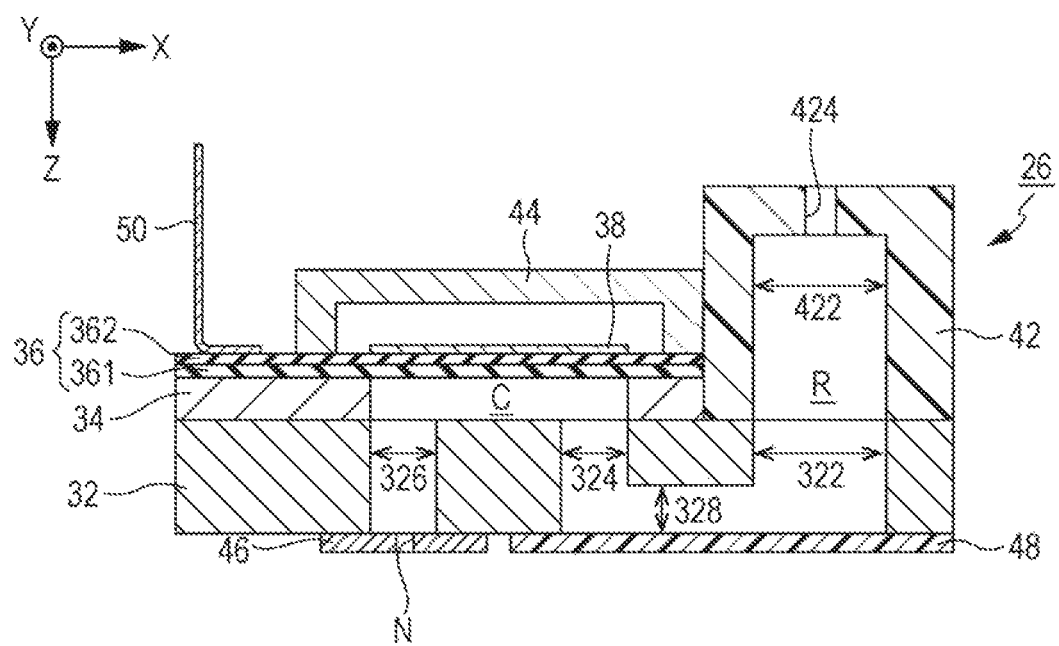
FIG. 3 is a sectional view of the liquid ejecting head.

FIG. 2 is an exploded perspective view of the liquid ejecting head 26, and FIG. 3 is a sectional view taken along the line III-III in FIG. 2. The section illustrated in FIG. 3 is a section parallel to the XZ plane. As illustrated in FIG. 2, the direction perpendicular to the XY plane is hereinafter referred to as the Z direction. The direction in which ink is ejected by each of the liquid ejecting heads 26 corresponds to the Z direction.

As illustrated in FIGS. 2 and 3, the liquid ejecting head 26 includes a flow path substrate 32 that is substantially rectangular and elongated in the Y direction. A pressure chamber substrate 34, a vibration plate 36, a plurality of piezoelectric elements 38, a casing portion 42, and a sealing body 44 are installed on a surface of the flow path substrate 32 on the negative side in the Z direction. On the other hand, a nozzle plate 46 and a vibration absorber 48 are installed on a surface of the flow path substrate 32 on the positive side in the Z direction. The elements of the liquid ejecting head 26 are each roughly a plate-shaped member elongated in the Y direction like the flow path substrate 32 and are joined to each other using, for example, an adhesive. It is preferable that the outer shape of the liquid ejecting head 26 be also elongated in the Y direction.

As illustrated in FIG. 2, the nozzle plate 46 is a plate-like member formed with a plurality of nozzles N disposed in the Y direction. Each of the nozzles N is a hole that allows ink to pass therethrough. Further, the flow path substrate 32, the pressure chamber substrate 34, and the nozzle plate 46 are each formed by processing a single-crystal substrate of, for example, silicon (Si) by a semiconductor manufacturing technique such as etching. However, the material and the manufacturing method of each element of the liquid ejecting head 26 are arbitrary. The Y direction can also be said to be a direction in which a plurality of nozzles N are disposed. In the liquid ejecting head 26 of the present embodiment, a plurality of nozzles N are formed at a high density of 300 or more per inch along the Y direction. That is, a plurality of nozzles N are formed at a density of 300 nozzles per inch (npi) or more along the Y direction. In a further preferred embodiment, a plurality of nozzles N are formed at a high density of 600 nozzles per inch (600 npi) or more along the Y direction.

The flow path substrate 32 is a plate member that forms a flow path of ink. As illustrated in FIGS. 2 and 3, an opening portion 322, supply flow paths 324, and communication flow paths 326 are formed in the flow path substrate 32. The opening portion 322 is a long through hole elongated in the Y direction so as to be continuous over the plurality of nozzles N in plan view as viewed from the Z direction. On the other hand, the supply flow paths 324 and the communication flow paths 326 are through holes formed individually for each of the nozzles N. In addition, as illustrated in FIG. 3, relay flow path 328 extending across the plurality of the supply flow paths 324 is formed on the surface of the flow path substrate 32 on the positive side in the Z direction. The relay flow path 328 is a flow path that enables the opening portion 322 and the plurality of supply flow paths 324 to communicate with each other.

The casing portion 42 is, for example, a structure manufactured by injection molding of a resin material and is fixed to the surface of the flow path substrate 32 on the negative side in the Z direction. As illustrated in FIG. 3, a housing portion 422 and an inlet 424 are formed in the casing portion 42. The housing portion 422 is a recessed portion having an outer shape corresponding to the opening portion 322 of the flow path substrate 32 and the inlet 424 is a through hole that communicates with the housing portion 422. As can be understood from FIG. 3, the space in which the opening portion 322 of the flow path substrate 32 and the housing portion 422 of the casing portion 42 communicate with each other functions as a liquid storage chamber R (reservoir). The ink that has been supplied from the liquid container 14 and passed through the inlet 424 is stored in the liquid storage chamber R.

The vibration absorber 48 is an element for absorbing pressure fluctuation in the liquid storage chamber R, and is configured to include, for example, a flexible sheet member that can elastically deform. More specifically, the vibration absorber 48 is installed on the surface of the flow path substrate 32 on the positive side in the Z direction so as to close the opening portion 322, the relay flow path 328, and the plurality of supply flow paths 324 of the flow path substrate 32 and form a bottom surface of the liquid storage chamber R.

As illustrated in FIGS. 2 and 3, the pressure chamber substrate 34 is a plate-like member in which a plurality of pressure chambers C corresponding to different nozzles N are formed. The plurality of the pressure chambers C are disposed along the Y direction. That is, the plurality of pressure chambers C are disposed along the Y direction in which the plurality of nozzles N are disposed at a high density. The direction in which the plurality of pressure chambers C are disposed may be expressed as the Y direction. Each of the pressure chambers C is an opening that is elongated along the X direction that intersects the Y direction in which the plurality of pressure chambers C are disposed in plan view. That is, the length of each of the pressure chambers C in the X direction is longer than the length in the Y direction intersecting the X direction. The end portion of the pressure chamber C on the positive side in the X direction overlaps with a corresponding one of the supply flow paths 324 of the flow path substrate 32 in plan view and the end portion of the pressure chamber C on the negative side in the X direction overlaps with a corresponding one of the communication flow paths 326 of the flow path substrate 32 in plan view. The liquid storage chamber R formed by the opening portion 322 and the housing portion 422 functions as a common liquid chamber that supplies ink to the plurality of pressure chambers C.

The vibration plate 36 is installed on a surface of the pressure chamber substrate 34 on the opposite side to the flow path substrate 32. The vibration plate 36 is an elastically deformable plate member. As illustrated in FIG. 3, the vibration plate 36 of this embodiment is formed by stacking a first layer 361 and a second layer 362. The second layer 362, when viewed from the first layer 361, is positioned on the opposite side to the pressure chamber substrate 34. The first layer 361 is formed of silicon oxide ($SiO_2$). The second layer 362 is formed of zirconium oxide ($ZrO_2$).

As can be understood from FIG. 3, the flow path substrate 32 and the vibration plate 36 oppose each other inside each of the pressure chambers C with a space therebetween. The pressure chamber C is located between the flow path substrate 32 and the vibration plate 36 and is a space for applying pressure to the ink filled in the pressure chamber C. The ink stored in the liquid storage chamber R branches from the relay flow path 328 into each of the supply flow paths 324 and is supplied to and fills in parallel the plurality of the pressure chambers C. As understood from the above description, the vibration plate 36 forms the wall surface of the pressure chamber C.

As illustrated in FIGS. 2 and 3, a plurality of piezoelectric elements 38 that correspond to different nozzles N are installed on a surface of the vibration plate 36 on the opposite side to the pressure chamber C (that is, a surface of the second layer 362). Each of the piezoelectric elements 38 is an actuator that deforms when a drive signal is supplied, and is formed to be elongated in the X direction intersecting the Y direction in which the plurality of pressure chambers C are disposed in plan view. The plurality of piezoelectric elements 38 are disposed in the Y direction so as to correspond to the plurality of pressure chambers C. When the vibration plate 36 vibrates in conjunction with the deformation of the piezoelectric element 38, the pressure in the pressure chamber C changes and consequently the ink filled in the pressure chamber C passes through the communication flow path 326 and the nozzle N and is ejected. That is, the piezoelectric element 38 causes ink in the pressure chamber C to be ejected from the nozzle N by vibrating the vibration plate 36.

The sealing body 44 of FIGS. 2 and 3 is a structure that protects the plurality of the piezoelectric elements 38 and reinforces the mechanical strength of the pressure chamber substrate 34 and the vibration plate 36 and is fixed to the surface of the vibration plate 36, for example, with an adhesive. The plurality of piezoelectric elements 38 are housed inside recessed portions formed on the surface of the sealing body 44 facing the vibration plate 36.

As illustrated in FIG. 3, for example, a wiring board 50 is bonded to the surface of the vibration plate 36. The wiring board 50 is a mounting component in which a plurality of wires (not illustrated) for electrically coupling the control unit 20 or the power supply circuit (not illustrated) to the liquid ejecting head 26 are formed. The wiring board 50, which is flexible, such as a flexible printed circuit (FPC) or a flexible flat cable (FFC) is suitably adopted. A drive signal for driving the piezoelectric elements 38 is supplied from the wiring board 50 to each of the piezoelectric elements 38.

Figure 4:
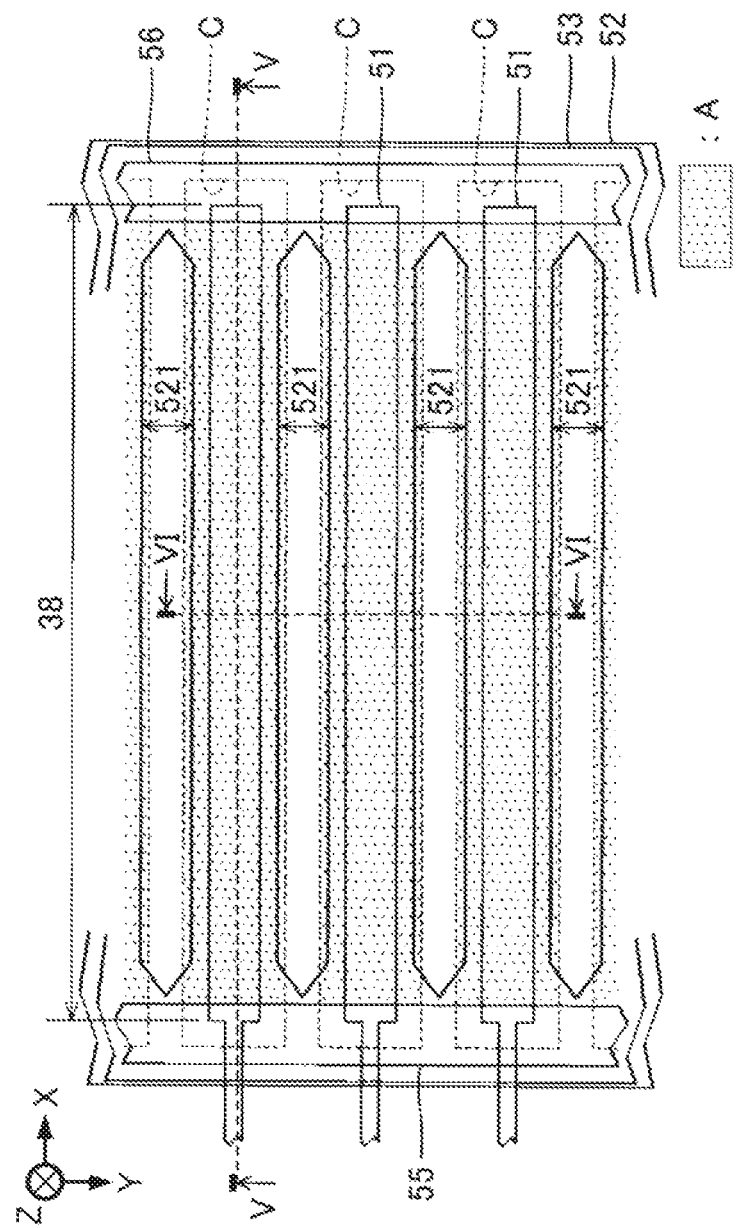
FIG. 4 is a plan view of a plurality of piezoelectric elements.

A specific configuration of each of the piezoelectric elements 38 will be described in detail below. FIG. 4 is a plan view of the plurality of piezoelectric elements 38. Further, in FIG. 4, the peripheral edge of an element located on the rear side of an arbitrary one element is also illustrated by a solid line for the sake of convenience. In addition, FIG. 5 is a sectional view taken along line V-V in FIG. 4, and FIG. 6 is a cross sectional view taken along line VI-VI in FIG. 4.

Figure 5:
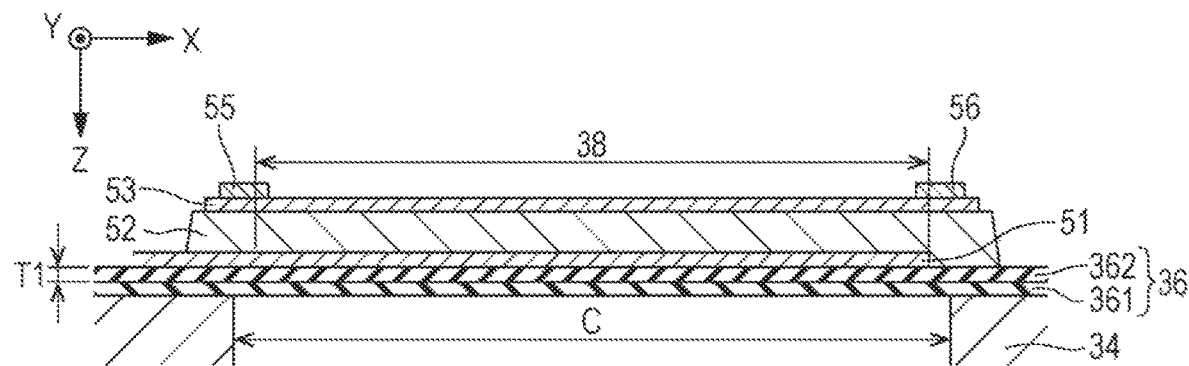
FIG. 5 is a sectional view taken along the line V-V in FIG. 4.
Figure 6:
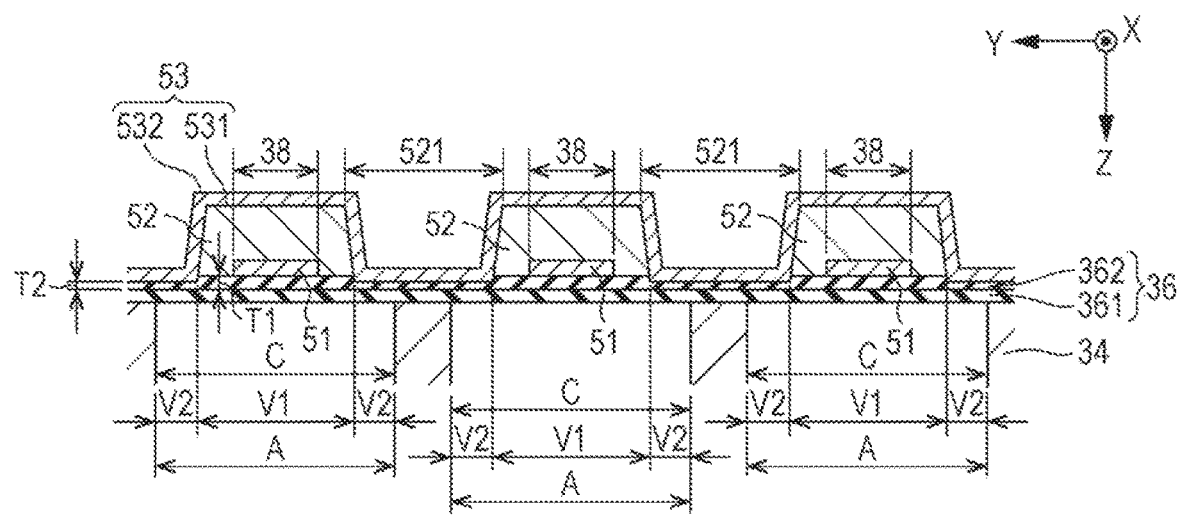
FIG. 6 is a sectional view taken along the line VI-VI in FIG. 4.

As illustrated in FIGS. 4 to 6, the piezoelectric elements 38 are each formed by stacking a first electrode 51, a piezoelectric layer 52, and a second electrode 53. Further, in the present specification, the expression "the element A and the element B are stacked" is not intended to be limited to a configuration in which the element A and the element B are in direct contact with each other. That is, a configuration in which another element C is interposed between the element A and the element B is included in the concept "the element A and the element B are stacked". In addition, the expression "the element B is formed on the surface of the element A" is not limited to a configuration in which the element A and the element B are in direct contact with each other as well. That is, even in a configuration in which the element C is formed on the surface of the element A and the element B is formed on the surface of the element C, as long as the element A and the element B at least partially overlap in plan view, the concept "the element B is formed on the surface of the element A" is included.

The first electrode 51 is formed on the surface of the vibration plate 36. The first electrodes 51 are individual electrodes formed so as to be separated from each other for each of the piezoelectric elements 38. Specifically, the plurality of the first electrodes 51 extending in the X direction are disposed in the Y direction at intervals. A drive signal for controlling the ejection of ink from the nozzles N corresponding to the piezoelectric elements 38 is applied to the first electrode 51 of each of the piezoelectric elements 38 via the wiring board 50.

The piezoelectric layer 52 is formed on the surface of the first electrode 51. The piezoelectric layer 52 is a band-shaped dielectric film extending in the Y direction so as to be continuous over the plurality of the piezoelectric elements 38. As illustrated in FIG. 4, notches 521 elongated in the X direction are formed in regions corresponding to the gap between the pressure chambers C adjacent to each other in plan view of the piezoelectric layer 52. The notches 521 are through holes penetrating the piezoelectric layer 52. According to the above configuration, each of the piezoelectric elements 38 is individually deformed for a corresponding one of the pressure chambers C and propagation of vibrations between the piezoelectric elements 38 is suppressed. Therefore, it is possible to control ink ejection characteristics of each of the nozzles N with high accuracy. The ejection characteristics are, for example, ejection quantity, ejection direction and ejection speed.

The second electrode 53 is formed on the surface of the piezoelectric layer 52. Specifically, the second electrode 53 is a band-like common electrode extending in the Y direction so as to be continuous over the plurality of the piezoelectric elements 38. A predetermined reference voltage is applied to the second electrode 53.

The piezoelectric layer 52 is deformed in accordance with the voltage difference between the drive signal applied to each of the first electrodes 51 and the reference voltage supplied to the second electrode 53. That is, a portion where the first electrode 51 and the second electrode 53 oppose each other with the piezoelectric layer 52 interposed therebetween functions as the piezoelectric element 38. The piezoelectric elements 38 are individually formed for each of the pressure chambers C. Specifically, the plurality of piezoelectric elements 38 formed elongated along the X direction intersecting the Y direction in which the plurality of pressure chambers C are disposed are disposed in the Y direction with a space therebetween. The width of the pressure chambers C in the Y direction is larger than the width of the piezoelectric elements 38 in the Y direction.

A first conductor 55 and a second conductor 56 are formed on the surface of the second electrode 53. The first conductor 55 is a band-like conductive film extending in the Y direction along an edge of the second electrode 53 on the negative side in the X direction. The second conductor 56 is a band-like conductive film extending in the Y direction along an edge of the second electrode 53 on the positive side in the X direction. The first conductor 55 and the second conductor 56 are formed from the same layer formed of a low-resistance conductive material such as gold (Au). By forming the first conductor 55 and the second conductor 56, a voltage drop of the reference voltage at the second electrode 53 is suppressed.

The first conductor 55 and the second conductor 56 also each function as a weight for suppressing deformation of the vibration plate 36 and the piezoelectric elements 38. That is, the region of the vibration plate 36 between the first conductor 55 and the second conductor 56 is a region (hereinafter referred to as a vibration region A) that vibrates in conjunction with deformation of the piezoelectric elements 38. The range of the vibration region A in the X direction is between an edge of the first conductor 55 on the positive side in the X direction and an edge of the second conductor 56 on the negative side in the X direction. The range of the vibration region A in the Y direction is between an edge of the pressure chamber C on the negative side in the Y direction and an edge of the pressure chamber C on the positive side in the Y direction. As can be understood from FIG. 6, a plurality of vibration regions A, which are elongated in the X direction and which intersect the Y direction in which the plurality of pressure chambers C are disposed, are disposed in the Y direction with a space therebetween. That is, the dimension of each of the vibration regions A in the Y direction is smaller than the dimension in the X direction. In the vibration area A of the vibration plate 36, there is a tendency for cracks to occur along the X direction in which the pressure chambers C are elongated.

As illustrated in FIG. 6, the vibration regions A of the vibration plate 36 include first portions V1 and second portions V2 in a transverse direction of the piezoelectric element 38. The first portions V1 overlap with the piezoelectric elements 38 in plan view and the second portions V2 are located outside the piezoelectric elements 38 in plan view. The second portions V2 corresponds to arm-like portions elastically supporting the first portions V1. As understood from FIG. 6, the film thickness T2 of the second layer 362 in the second portion V2 is smaller than the film thickness T1 of the second layer 362 in the first portion V1. That is, in the second portion V2, the second layer 362 of the vibration plate 36 is partially removed in the Z direction.

Cracks may occur in the vibration plate 36. Specifically, a crack (hereinafter referred to as "longitudinal crack") occurring along the long side of the vibration region A and a crack (hereinafter referred to as "transverse crack") occurring along the short side of the vibration region A, can occur in the vibration plate 36. In addition, in a state in which a transverse crack occurs, burning (hereinafter referred to as "edge burning") may occur at the peripheral edge of the second electrode 53 in the vicinity of the transverse crack. The inventors of the present application investigated the correlation between the mode of failure (hereinafter referred to as "failure mode") exemplified above and the film thickness T1 of the second layer 362 of the vibration plate 36. The failure modes are longitudinal cracks, transverse cracks and edge burning.

Figure 7:
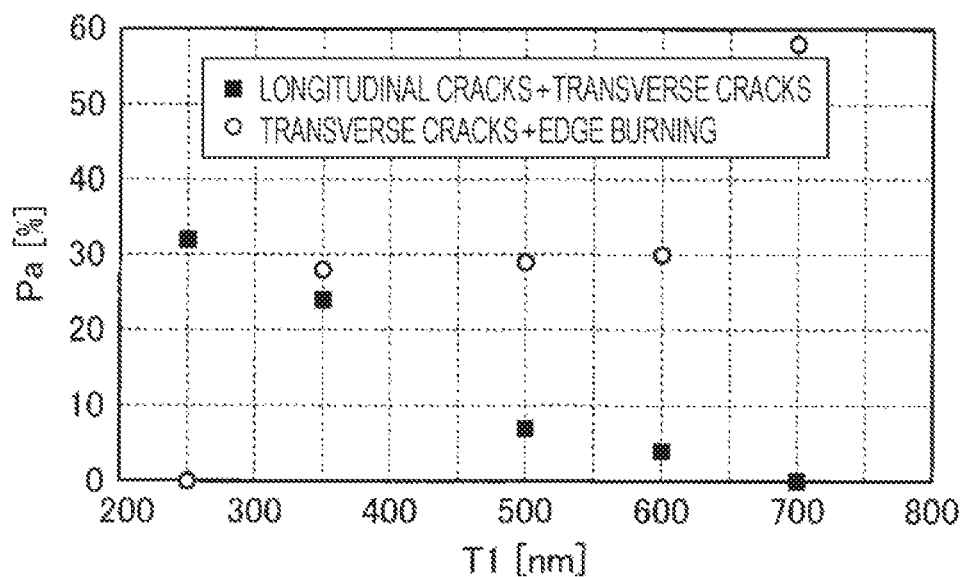
FIG. 7 is a graph illustrating a relationship between a film thickness of a second layer of a vibration plate and a failure incidence rate for each failure mode.
Figure 8:
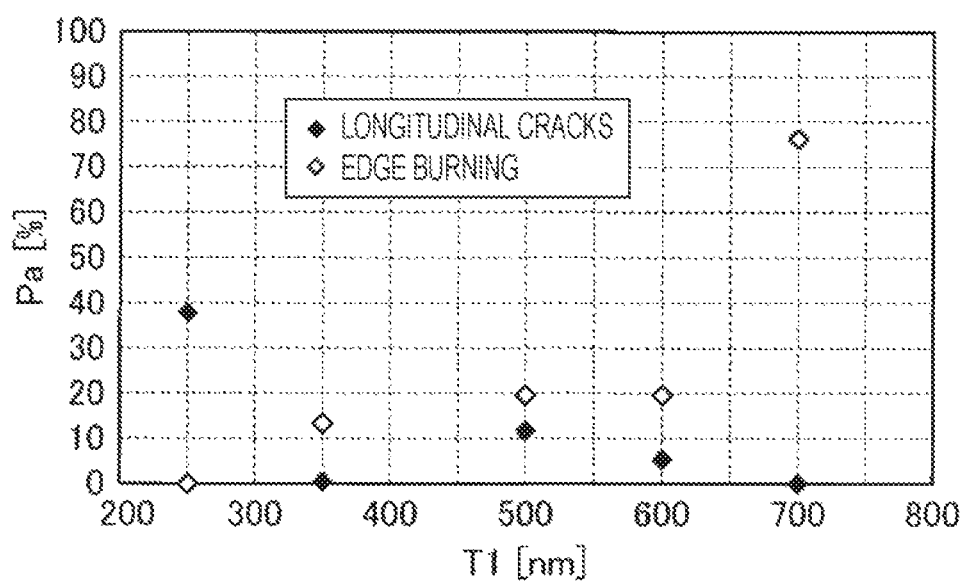
FIG. 8 is a graph illustrating the relationship between the film thickness of the second layer of the vibration plate and the failure incidence rate for each failure mode.

FIGS. 7 and 8 are graphs illustrating a ratio Pa (hereinafter referred to as "failure incidence rate") of the piezoelectric element 38 in which each failure mode was observed for each of a plurality of cases where the liquid ejecting head 26 having the vibration area A elongated in the X direction intersecting with the Y direction in which the plurality of pressure chambers C are disposed was used and in which the film thickness T1 of the second layer 362 was varied. In FIGS. 7 and 8, the voltage applied to each of the plurality of piezoelectric elements 38 is incrementally increased within a predetermined range and the ratio of the piezoelectric elements 38 in which failure by each failure mode eventually occurred is plotted as the failure incidence rate Pa on the vertical axis. Specifically, in FIG. 7, failure incidence rates Pa for both longitudinal cracks and transverse cracks, and failure incidence rates Pa for both transverse cracks and edge burning are illustrated. In FIG. 8, the failure incidence rate Pa for longitudinal cracks and the failure incidence rate Pa for edge burning are illustrated. As understood from FIGS. 7 and 8, as the film thickness T1 of the second layer 362 becomes smaller, longitudinal cracks are more likely to occur, and as the film thickness T1 of the second layer 362 becomes larger, transverse cracks and burning tend to occur more easily.

Figure 9:
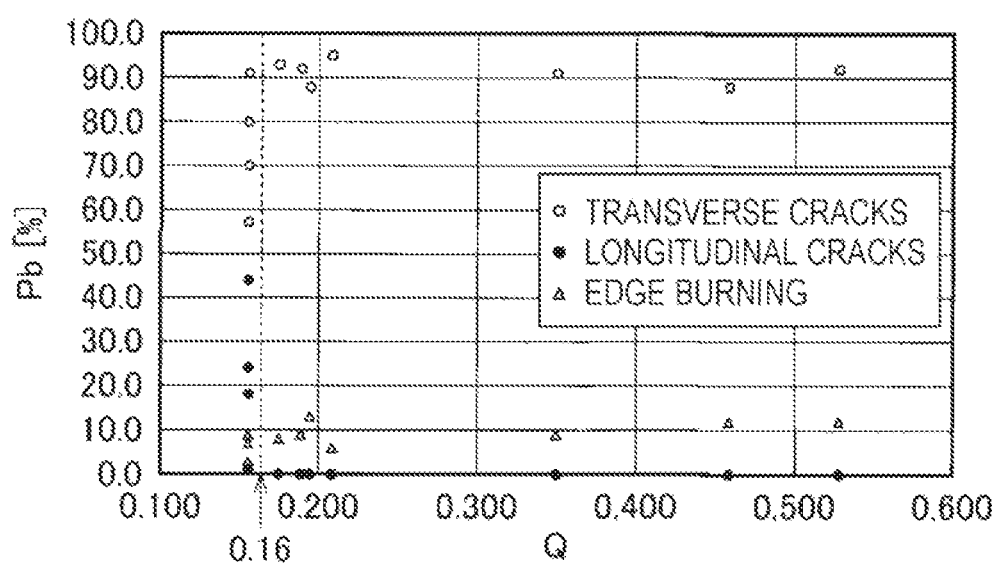
FIG. 9 is a graph illustrating a relationship between a film thickness ratio of the vibration plate and a failure mode incidence rate.

FIG. 9 is a graph illustrating the incidence rate Pb of each failure mode (hereinafter referred to as "failure mode incidence rate") for each of a plurality of cases where the liquid ejecting head 26 having the vibration region A elongated in the X direction intersecting the Y direction in which the plurality of pressure chambers C are disposed was used, and a ratio Q (hereinafter referred to as "film thickness ratio") of the film thickness T1 of the second layer 362 to the film thickness Ta of the first layer 361 was varied. FIG. 10 is a table illustrating each numerical value of FIG. 9. Further, in FIG. 10, in addition to the film thickness T1 of the first portion V1 and the film thickness T2 of the second portion V2 of the vibration region A and the film thickness ratio Q, a width Wc of the pressure chamber C, a width Wp of the piezoelectric layer 52, a width W1 of the first electrode 51, and a film thickness Ta of the first layer 361 are also recorded. In FIG. 9, the voltage applied to each of the piezoelectric elements 38 is incrementally increased until failure occurs in the piezoelectric element 38 or the vibration plate 36, and the ratio of the number of failure modes finally observed is plotted as a failure mode incidence rate Pb on the vertical axis. Therefore, the total value of each failure mode incidence rate over the three types of failure modes is 100%. As understood from FIGS. 9 and 10, when the film thickness ratio Q (Q=T1/Ta) is less than 0.16, both longitudinal cracks and transverse cracks occur. On the other hand, in the configuration in which the film thickness ratio Q is 0.16 or more, it is confirmed from FIGS. 9 and 10 that most of the observed failure modes are transverse cracks and no longitudinal cracks are observed.

Figure 11:
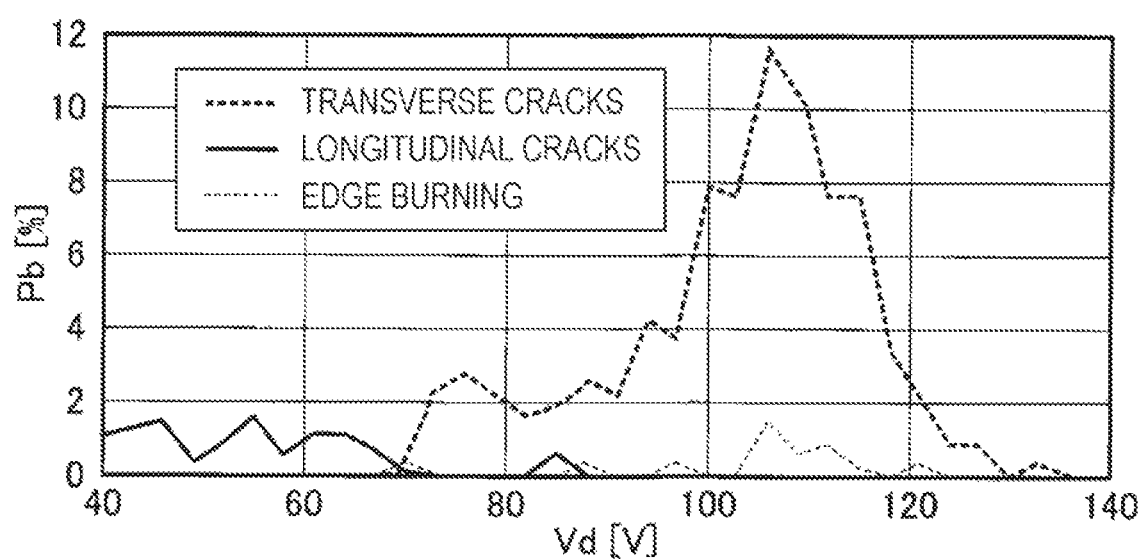
FIG. 11 is a graph illustrating a relationship between an applied voltage of the piezoelectric element and each failure mode incidence rate.

FIG. 11 is a graph illustrating the relationship between the applied voltage Vd of the piezoelectric element 38 at the time when failure occurs in the vibration plate 36 or the piezoelectric element 38 in the tests of FIGS. 9 and 10 and each of the failure mode incidence rates Pb. As understood from FIG. 11, unless a high voltage of about 70 V or more is applied to the piezoelectric element 38, transverse cracks do not occur in the vibration plate 36, whereas longitudinal cracks tend to occur in the vibration plate 36 even if a voltage of 70 V or less is applied to the piezoelectric element 38. Therefore, as described with reference to FIG. 9, from the tendency that the majority of the failure modes are transverse cracks in the configuration in which the film thickness ratio Q is set to 0.16 or more, by setting the film thickness ratio Q to 0.16 or more, it is presumed that longitudinal cracks can be effectively suppressed under a configuration in which the voltage applied to the piezoelectric element 38 is suppressed to 70 V or less. Considering the above results, in the present embodiment, the film thickness ratio Q is set to 0.16 or more.

In addition, as described above, there is a tendency that longitudinal cracks are less likely to occur as the film thickness T1 of the second layer 362 becomes larger. Considering the above tendency, it is preferable that a sufficient thickness is secured for the film thickness T1 of the second layer 362. Specifically, referring to FIGS. 9 and 10, when the film thickness T1 of the second layer 362 is 300 nm or more, it is possible to observe a tendency that the occurrence of longitudinal cracks in the vibration plate 36 is effectively suppressed. In consideration of the above results, in the present embodiment, the film thickness T1 of the second layer 362 of the vibration plate 36 is set to 300 nm or more. In a further preferred embodiment, the film thickness T1 of the second layer 362 is set to 500 nm or more.

In addition, as understood from FIGS. 7 and 8, when the film thickness T1 of the second layer 362 is 600 nm or less, there is a tendency that suppression of longitudinal cracks and suppression of transverse cracks and burning can be achieved at the same time. In consideration of the above tendency, in the present embodiment, the film thickness T1 of the second layer 362 is set to 600 nm or less. According to the above configuration, there is an advantage that suppression of longitudinal cracks and suppression of transverse cracks and burning can be achieved at a high level.

As described above, according to the present embodiment, the film thickness ratio Q of the second layer 362 to the first layer 361 of the vibration plate 36 is set to 0.16 or more, the film thickness T1 of the second layer 362 is set to 300 nm or more. Therefore, it is possible to effectively suppress longitudinal cracks as well as transverse cracks and edge burning of the vibration plate 36.

Modifications

Each embodiment exemplified above can be variously modified. Specific modification examples that can be applied to each of the above-described embodiments are given below. Further, two or more examples arbitrarily chosen from the following examples can be combined appropriately as long as they do not contradict each other.

(1) In the above embodiment, the first conductor 55 and the second conductor 56 are formed on the surface of the second electrode 53; however, the first conductor 55 and the second conductor 56 may be omitted. In the configuration in which the first conductor 55 and the second conductor 56 are omitted, the range of the vibration region A in the X direction is the range between the positive side edge and the negative side edge in the X direction in the pressure chamber C, that is, the range in which the piezoelectric layer 52 vibrates.

(2) In each of the above embodiments, a configuration in which the first electrode 51 is the individual electrode and the second electrode 53 is the common electrode has been exemplified; however, the first electrode 51 may be a continuous common electrode over the plurality of the piezoelectric elements 38, and the second electrode 53 may be set as a separate individual electrode for each of the piezoelectric elements 38. In addition, both the first electrode 51 and the second electrode 53 may be individual electrodes.

(3) In each of the above-described embodiments, the liquid ejecting apparatus 100, which is of the serial type, reciprocating the transport body 242 with the liquid ejecting head 26 mounted thereon is exemplified, but the disclosure is also applicable to a line-type liquid ejecting apparatus in which a plurality of nozzles N are distributed over the entire width of the medium 12.

(4) The liquid ejecting apparatus 100 exemplified in each of the above-described embodiments can be employed in various apparatuses such as a facsimile apparatus and a copying machine, in addition to an apparatus dedicated for printing. However, the use of the liquid ejecting apparatus of this disclosure is not limited to printing. For example, a liquid ejecting apparatus that ejects a solution of color materials can be used as a manufacturing device for forming the color filters of liquid crystal displays. In addition, a liquid ejecting apparatus that ejects a solution of conductive materials can be used as a manufacturing device for forming wiring or electrodes of a wiring substrate or the like.

What is claimed is:

1. A liquid ejecting head comprising:
a vibration plate that forms a wall surface of a pressure chamber filled with a liquid; and
a piezoelectric element which vibrates the vibration plate to eject the liquid in the pressure chamber from a nozzle, wherein
the vibration plate includes
a first layer formed of silicon oxide, and
a second layer formed of zirconium oxide on a side opposite to the pressure chamber when viewed from the first layer, wherein
a ratio of a film thickness of the second layer to a film thickness of the first layer is 0.16 or more, and
the film thickness of the second layer is 500 nm or more.

2. The liquid ejecting head according to claim 1,
wherein the film thickness of the second layer is 600 nm or less.

3. The liquid ejecting head according to claim 1,
wherein pressure chambers filled with the liquid are provided in a first direction, and
a length of the pressure chambers in the first direction is longer than a length of the pressure chambers in a second direction intersecting the first direction.

4. The liquid ejecting head according to claim 3,
wherein a density of the nozzles in the first direction is 300 npi or more.

5. The liquid ejecting head according to claim 4,
wherein the density of the nozzles in the first direction is 600 npi or more.

6. The liquid ejecting head according to claim 3,
wherein a width of the pressure chambers in the first direction is larger than a width of the piezoelectric layer of the piezoelectric element in the first direction.

7. The liquid ejecting head according to claim 3, wherein the ratio of the film thickness of the second layer to the film thickness of the first layer is 0.35 or less.

8. A liquid ejecting apparatus comprising:
the liquid ejecting head according to claim 1.

* * * * *